US011444618B2

(12) United States Patent
Balakrishnan

(10) Patent No.: US 11,444,618 B2
(45) Date of Patent: Sep. 13, 2022

(54) HIGH-SIDE SWITCH AND LOW-SIDE SWITCH LOSS EQUALIZATION IN A MULTIPHASE SWITCHING CONVERTER

(71) Applicant: TEXAS INSTRUMENTS INCORPORATED, Dallas, TX (US)

(72) Inventor: Manu Balakrishnan, Kollam (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 54 days.

(21) Appl. No.: 16/707,160

(22) Filed: Dec. 9, 2019

(65) Prior Publication Data

US 2020/0186144 A1 Jun. 11, 2020

(30) Foreign Application Priority Data

Dec. 11, 2018 (IN) .............................. 201841046809

(51) Int. Cl.
*H03K 17/56* (2006.01)
*H02M 7/217* (2006.01)
*H03K 4/06* (2006.01)

(52) U.S. Cl.
CPC .......... *H03K 17/56* (2013.01); *H02M 7/2173* (2013.01); *H03K 4/06* (2013.01)

(58) Field of Classification Search
CPC ........ H03K 17/56; H03K 17/602; H03K 4/06; H03K 4/08; H02M 7/2173
See application file for complete search history.

(56) References Cited

U.S. PATENT DOCUMENTS

| 4,875,148 A * | 10/1989 | Roe ...................... H02M 7/5387 363/41 |
| 7,898,233 B2 * | 3/2011 | Sato .................... H02M 3/1584 323/283 |
| 2009/0284194 A1 * | 11/2009 | Forte ................. H02M 7/53871 318/400.02 |
| 2015/0188465 A1 * | 7/2015 | Soh ......................... H02P 6/182 318/400.35 |
| 2020/0304049 A1 * | 9/2020 | Li ........................... H02P 27/08 |

\* cited by examiner

*Primary Examiner* — Patrick C Chen
(74) *Attorney, Agent, or Firm* — John R. Pessetto; Charles A. Brill; Frank D. Cimino

(57) ABSTRACT

An electrical system includes a motor and a plurality of switch pairs, each switch pair having a high-side switch, a low-side switch, and a switch node coupled to the motor. The electrical system also includes gate driver circuitry coupled to each switch of the plurality of switch pairs. The electrical system also includes a controller coupled to the gate driver circuitry. The controller is configured to direct the gate driver circuitry to provide a first set of gate drive signals together with (i.e., overlapping pulses) a second set of gate drive signals, wherein the first set of gate drive signals is phase-shifted relative to the second set of gate drive signals.

8 Claims, 11 Drawing Sheets

HIGH-SIDE SWITCH AND LOW-SIDE SWITCH LOSS EQUALIZATION IN A MULTIPHASE SWITCHING CONVERTER

CROSS-REFERENCE TO RELATED APPLICATIONS

This application claims priority to Indian Provisional Application No. 201841046809, filed Dec. 11, 2018, which is hereby incorporated by reference.

BACKGROUND

Half-bridge, full-bridge, or multiphase power stages are used across multiple motor drives or other inverters. Some pulse-width modulation controllers of these power stages create un-equal RMS (root-mean square) current between high-side and low-side power switches of a power stage. This causes unequal losses and hence unequal heating between the high-side and low-side switches. Some efforts to account for unequal losses or unequal heating involve use of different switches (e.g., with different on-state resistances) for the high-side and low-side switches, which increases design complexity. Another option to account for unequal losses or unequal heating involves providing more cooling for the switch with more losses. The unequal loss also causes reduced torque capability for a motor drive at lower speed or duty-cycle. The existing options of pulse width modulation technique do not provide an optimum solution across the operating duty-cycle as the losses of the high-side and low-side switches depend on the duty-cycle.

SUMMARY

In accordance with at least one example of the disclosure, an electrical system comprises a motor. The electrical system also comprises a plurality of switch pairs, each switch pair having a high-side switch, a low-side switch, and a switch node coupled to the motor. The electrical system also comprises gate driver circuitry coupled to each switch of the plurality of switch pairs. The electrical system also comprises a controller coupled to the gate driver circuitry. The controller is configured to direct the gate driver circuitry to provide a first set of gate drive signals together with a second set of gate drive signals, wherein the first set of gate drive signals is phase-shifted relative to the second set of gate drive signals.

In accordance with at least one example of the disclosure, a multiphase switching converter comprises gate driver circuitry and a controller coupled to the gate driver circuitry. The controller comprises a first pulse generation path configured to generate a first high-side control signal with a first duty-cycle. The controller also comprises a second pulse generation path configured to generate a first low-side control signal with a complementary duty-cycle relative to the first duty-cycle. The controller also comprises a third pulse generation path configured to generate a second high-side control signal with the complementary duty-cycle. The controller also comprises a fourth pulse generation path configured to generate a second low-side control signal with the first duty-cycle. The second high-side control signal is phase-shifted relative to the first low-side control signal. The second low-side control signal is phase-shifted relative to the first high-side control signal.

In accordance with at least one example of the disclosure, a multiphase switching converter controller comprises a first pulse generation path configured to generate a first high-side control signal with a first duty-cycle. The multiphase switching converter controller also comprises a second pulse generation path configured to generate a first low-side control signal with a complementary duty-cycle relative to the first duty-cycle. The multiphase switching converter controller also comprises a third pulse generation path configured to generate a second high-side control signal with the complementary duty-cycle. The multiphase switching converter controller also comprises a fourth pulse generation path configured to generate a second low-side control signal with the first duty-cycle. The second high-side control signal is phase-shifted relative to the first low-side control signal. The second low-side control signal is phase-shifted relative to the first high-side control signal.

BRIEF DESCRIPTION OF THE DRAWINGS

For a detailed description of various examples, reference will now be made to the accompanying drawings in which.

DETAILED DESCRIPTION

Figure 1:
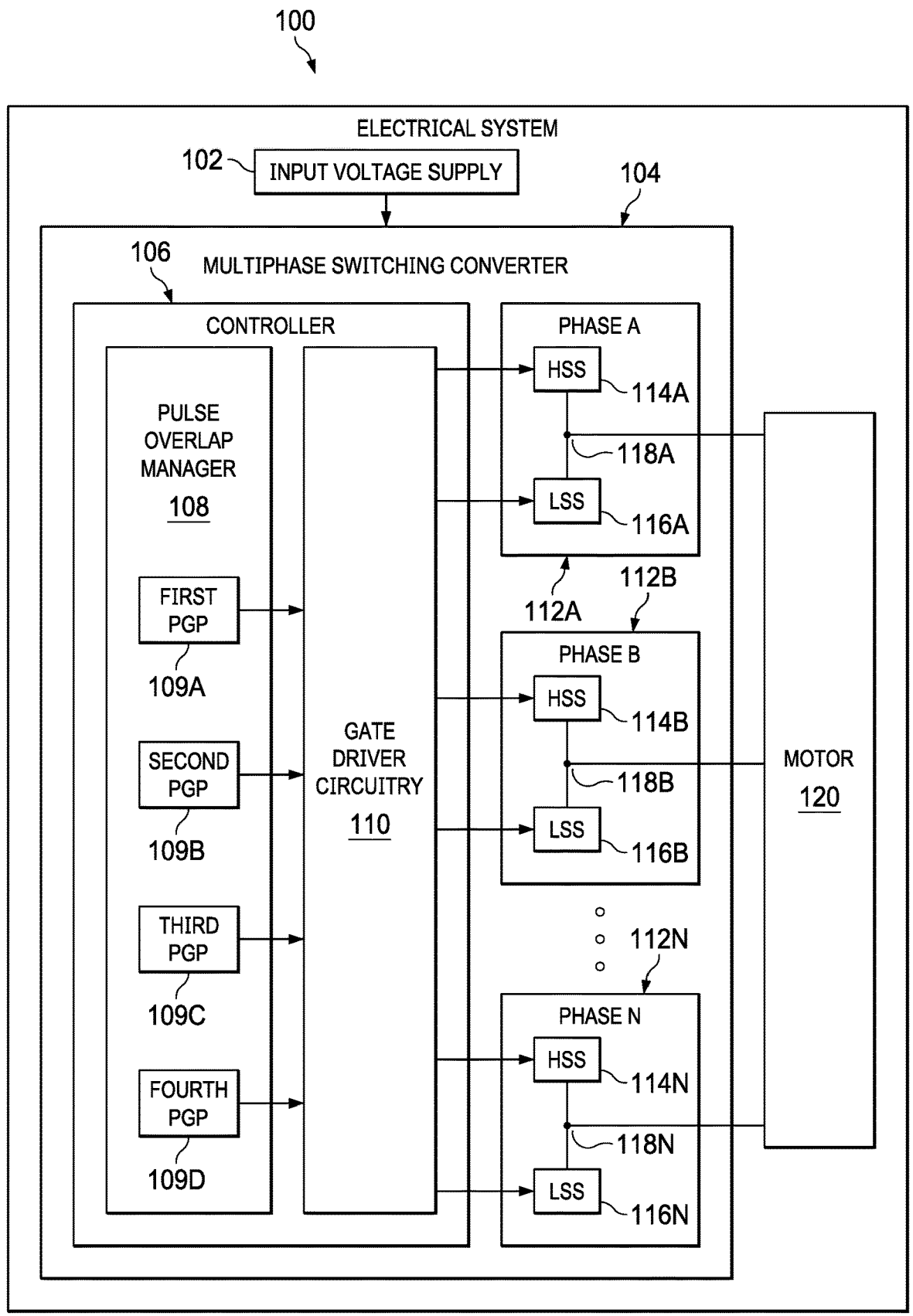
FIG. 1 is a block diagram showing an electrical system in accordance with some examples.

Disclosed herein are loss equalization control options for a multiphase switching converter. The multiphase switching converter is used, for example, to drive current to different phases of a motor. In an example electrical system, a multiphase switching converter includes a plurality of switch pairs, each switch pair having a high-side switch, a low-side switch, and a switch node coupled to a motor. The electrical system also includes gate driver circuitry coupled to each switch of the plurality of switch pairs. The electrical system also includes a controller coupled to the gate driver circuitry. The controller is configured perform loss equalization by directing the gate driver circuitry to provide a first set of gate drive signals and a second set of gate drive signals, where the first set of gate drive signals is phase-shifted relative to the second set of gate drive signals.

In one example, if the multiphase switching converter corresponds to a three-phase inverter and a six-step control cycle (with six 60 degree phases in a 360 degree control cycle) is used, a first phase of the control cycle involves providing the first set of gate drive signals to a first switch pair of the plurality of switch pairs and providing the second set of gate drive signals to a second switch pair of the plurality of switch pairs. In a second phase of the control cycle, the first set of gate drive signals is again provided to the first switch pair and the second set of gate drive signals is provided to a third switch pair of the plurality of switch pairs. In a third phase of the control cycle, the first set of gate drive signals is provided to the second switch pair and the second set of gate drive signals is again provided to the third switch pair. In a fourth phase of the control cycle, the first set of gate drive signals is again provided to the second switch pair and the second set of gate drive signals is provided to the first switch pair. In a fifth phase of the control cycle, the first set of gate drive signals is provided to the third switch pair and the second set of gate drive signals is again provided to the first switch pair. In a sixth phase of the control cycle, the first set of gate drive signals is again provided to the third switch pair and the second set of gate drive signals is provided to the second switch pair. With the proposed control scheme, loss equalization and related heat dissipation for the plurality of switch pairs is improved compared to previous control schemes.

To explain the losses in the switches and related heat dissipation issues better, consider an example scenario involving a brushless DC (BLDC) motor and a three-phase inverter with trapezoidal (six step) control and unipolar pulse-width modulation (PWM). For this scenario, the control cycle involves a 120 degree interval where two motor windings (two phases) conduct at a time while the third motor winding is not used. During this interval of the control cycle, a first switch pair receives complementary high-side and low-side gate drive signals (referred to an active freewheeling) at a duty-cycle (D) and PWM frequency (for example 20 kHz), while a second switch pair keeps the low-side switch continuously on. During another 120 degree interval of the control cycle the first switch pair keeps the low-side switch continuously on, while a second switch pair or third switch pair does active freewheeling. During yet another 120 degree interval of the control cycle the first switch pair keeps both high-side and low-side switches to off, while one of the second or third switch pair does active freewheeling and another one of the second or third switch pair keeps the low side switch continuously on. This completes one control cycle of 360 degree. For any switch pair, in the 360 degree cycle period, the RMS (root mean square) current in the high-side switch is $I_{TOP}$, $$I_{TOP,RMS} = \frac{I_W}{\sqrt{3}}$$

and the RMS current in the low-side switch is $I_{BOT}$, $$I_{BOT,RMS} = \frac{I_W}{\sqrt{3}} \times \sqrt{1+(1-D)},$$

where $I_W$ is the peak winding current and D is the voltage switching duty-cycle of the three-phase inverter, and D is same as the duty-cycle of all the high-side switches for their respective 120 degree period in the existing PWM method. During active freewheeling, the low-side switches conduct at a complementary duty-cycle relative to the high-side switch of the same switch pair. Hence, during the active freewheeling period, the duty-cycle of a low-side switch is 1-D. For a switch, duty-cycle defined as the ratio of the time period in which the switch is on relative to the total PWM period, where the PWM period is the sum of a switch's ON time and OFF time.

With the example scenario, the low-side switch of the first switch pair heats up more than the high-side switch. For example, at 50% duty-cycle (D=0.5), $$I_{TOP,RMS} = \frac{I_W}{\sqrt{3}} \text{ and } I_{BOT,RMS} = \frac{I_W}{\sqrt{3}} \times \sqrt{1+(1-0.5)} = 1.225 \times \frac{I_W}{\sqrt{3}}.$$

Also, the power loss is proportional to square of current such that the power loss in the high-side and low-side switches of a switch pair are related by $P_{BOT}=1.5 \times P_{TOP}$. Thus, at D=0.25, $P_{BOT}=1.75 \times P_{TOP}$ and unequal power loss increases the likelihood of overheating of the low-side switch at lower duty-cycles. This results in reduced torque capability of the motor drive at lower speed or duty-cycle. For some electrical systems, full torque capability even at low duty-cycles is desired (e.g., end equipment such as corded or cordless tools and e-Bikes).

The disclosed loss equalization control options for a multiphase switching converter addresses unequal loss, overheating, and low torque issues. To provide a better understanding, various loss equalization control options and related circuits and systems are described using the figures as follows.

FIG. 1 is a block diagram showing an electrical system 100 in accordance with some examples. As shown, the electrical system 100 includes an input voltage supply 102 (e.g., a battery or power adapter), a multiphase switching converter 104, and a motor 120. Examples of the electrical system 100 include end equipment such as corded tools, cordless tools, e-Bikes, or other end equipment with single or multiphase motors. In the example of FIG. 1, the multiphase switching converter 104 includes a controller 106 couples to a plurality of switch pairs 112A-112N (labeled as phase A to phase N). As shown, the switch pairs 112A-112N include respective high-side switches (HSS) 114A-114N, low-side switches (LSS) 116A-116N, and switch nodes 118A-118N, where the motor 120 is coupled to the switch nodes 118A-118N. In some examples, the multiphase switching converter 104 is a three-phase inverter and the plurality of switch pairs 112A-112N corresponds to three switch pairs.

In the example of FIG. 1, the controller 106 includes a pulse overlap manager 108 coupled to gate driver circuitry 110, where the pulse overlap manager 108 is configured to direct the gate driver circuitry 110 to provide a first set of gate drive signals and a second set of gate drive signals (e.g., for one of an AB, AC, BC, BA, CA, or CB phase of a control cycle), and where the first set of gate drive signals is phase-shifted relative to the second set of gate drive signals to create overlapped drive signals for the first set of gate drive signals and second set of gate drive signals. In some examples, the first set of gate drive signals includes a high-side gate drive signal with a first duty-cycle and a low-side gate drive signal with a complementary duty-cycle relative to the first duty-cycle. Also, the second set of gate drive signals includes a high-side gate drive signal with the complementary duty-cycle and a low-side gate drive signal with the first duty-cycle. In the example of FIG. 1, the pulse overlap manager 108 is represented as having a first pulse generation path (PGP) 109A, a second PGP 109B, a third PGP 109C, and a fourth PGP 109D.

In some examples (see e.g., FIG. 5), the pulse overlap manager 108 and PGPs 109A-109D corresponds a microcontroller unit (MCU) that uses a digital counter or timer and related thresholds to provide PWM (control) signals that are then used by the gate driver circuitry 110 to provide the first set of gate drive signals and the second set of gate drive signals. In other examples (see e.g., FIG. 12), the pulse overlap manager 108 and PGPs 109A-109D correspond to analog components (e.g., a triangular wave generator, comparators, upper and lower reference sources, and/or other components) configured to provide PWM signals that are then used by the gate driver circuitry 110 to provide the first set of gate drive signals and the second set of gate drive signals. In a three-phase inverter example, the controller 106 is configured to direct the gate driver circuitry 110 to provide the first set of gate drive signals and the second set of gate drive signals to each of a first switch pair, a second switch pair, and a third switch pair in different 120 degree intervals of a 360 degree control cycle, where the different 120 degree intervals are spaced from each other by 60 degrees. With the controller 106 and related operations, loss inequality and overheating issues related to HSS 114A-114N and/or LSS 112A-112N are alleviated as well as related low torque issues.

In some examples, the controller 106 is configured to direct the gate driver circuitry 110 to provide the first set of gate drive signals and the second set of gate drive signals to each of the plurality of switch pairs 112A-112N in different intervals (e.g., 120 degree intervals) of a 360 degree control cycle, wherein the different intervals are spaced from each other (e.g., by 60 degrees). In some examples, for every 60 degrees of the 360 degree control cycle, the controller is configured to direct the gate driver circuitry to maintain one of the first and second sets of gate drive signals to one of the plurality of switch pairs 112A-112N and to transition one of the first and second sets of gate drive signals to another of the plurality of switch pairs 112A-112N. In some examples, the controller 106 is configured to select the first duty-cycle and the complementary duty-cycle based on a target PWM frequency and a target performance parameter (e.g., target winding current of the motor 120 and/or a target voltage switching duty-cycle of the motor 120). For example, when the motor torque or speed (target performance parameter) has to be increased, the first duty-cycle is increased and the corresponding complementary duty-cycle is decreased. In different examples, the PWM frequency varies from a few kHz to a few hundreds of kHz depending on the target peak-to-peak ripple in the motor current, where motor current ripple is a function of the motor voltage switching duty-cycle 'D' and the PWM frequency.

In some examples, the controller 106 comprises a digital counter or timer (e.g., part of the pulse overlap manager) configured to provide an up-down ramp with an upper threshold and a lower threshold, wherein the controller 106 selects the first duty-cycle and the complementary duty-cycle based on the upper and lower thresholds, and wherein the upper and lower thresholds are selected based on a target voltage switching duty-cycle of the motor 120. In some examples, the motor 120 is a BLDC motor, and wherein the controller 106 is configured to manage timing of the first set of gate drive signals and the second set of gate drive signals for the plurality of switch pairs 112A-112N to support a target current to generate a target torque from the motor 120.

Figure 2:
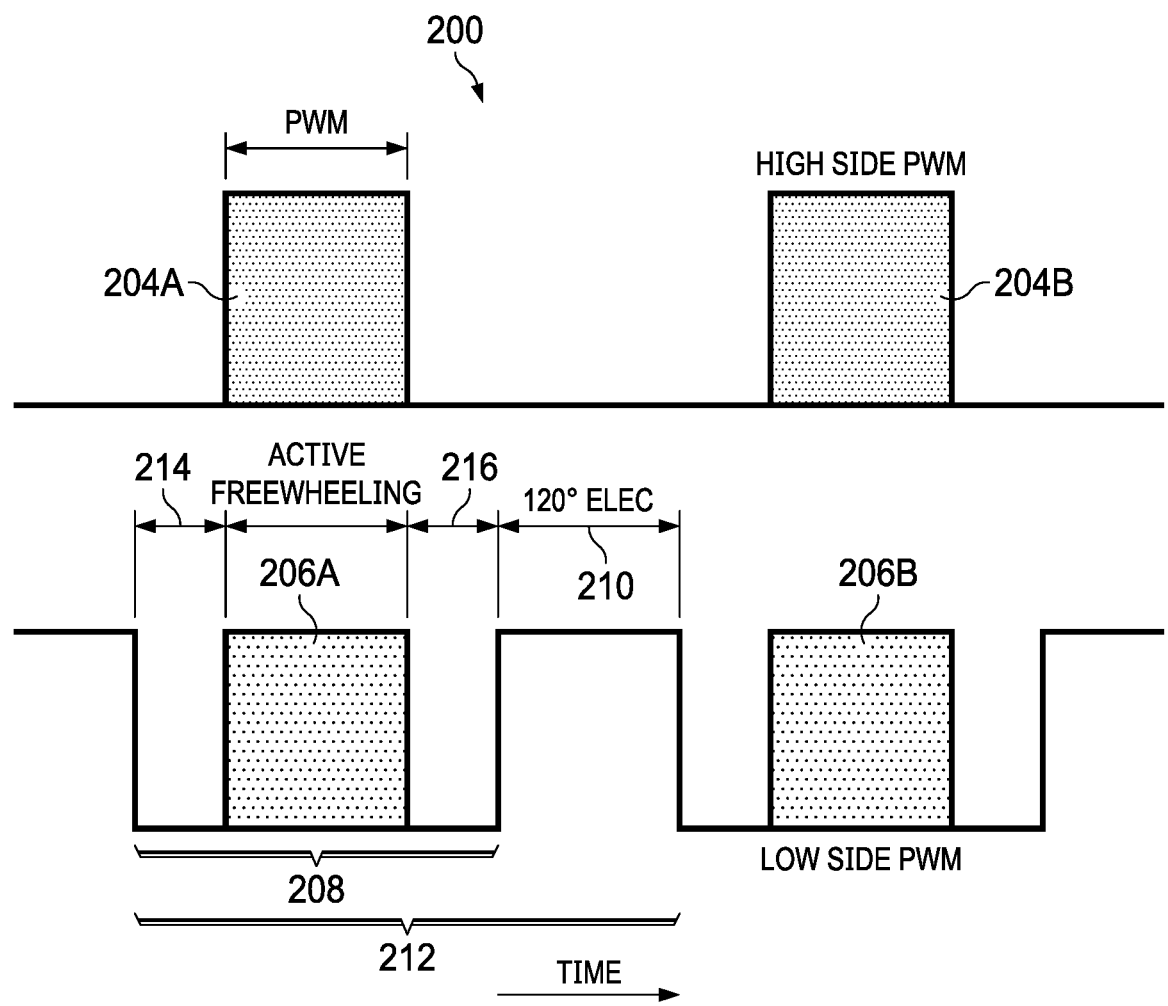
FIG. 2 is a timing diagram showing control signals for a switch pair of a half-bridge of a brushless DC motor in accordance with some examples.

FIG. 2 is a timing diagram 200 showing control signals for a switch pair of a half-bridge of a brushless DC motor in accordance with some examples. In the timing diagram 200, a complete control cycle (referred to as a trapezoid control technique, trapezoidal control technique, or six step control technique) for one switch pair corresponds to interval 212. In some examples, multiple switch pairs are used to support different motor phases, where each switch pair is has a similar control cycle (e.g., offset by 60 degrees) as the one represented in the timing diagram 200.

Within the complete control cycle represented in the timing diagram, there is an active freewheeling interval (e.g., 120 degrees) of the high-side PWM 204A and a complementary low-side PWM 206A (e.g., at a PWM frequency of 20 kHz) to generate positive current into the motor winding $L_A$ (current flows into motor winding). Before the active freewheeling interval, there is a pause interval 214 (e.g., 60 degrees) in which the switches of the switch pair are off. After the active freewheeling interval, there is another pause interval 216 (e.g., 60 degrees) in which the switches of the switch pair are off. After the pause interval 216, there is another interval 210 in which the high-side switch stays off and the low-side switch stays on to generate negative current out of the motor winding $L_A$ (current flows out of motor winding). With the control scheme represented in the timing diagram 200, the low-side switch of a switch pair will stay on for more time on average compared to the high-side switch, resulting in issues such as unequal losses, unequal heating, increased cooling complexity, and/or reduced torque capability at lower duty-cycle.

Figure 3:
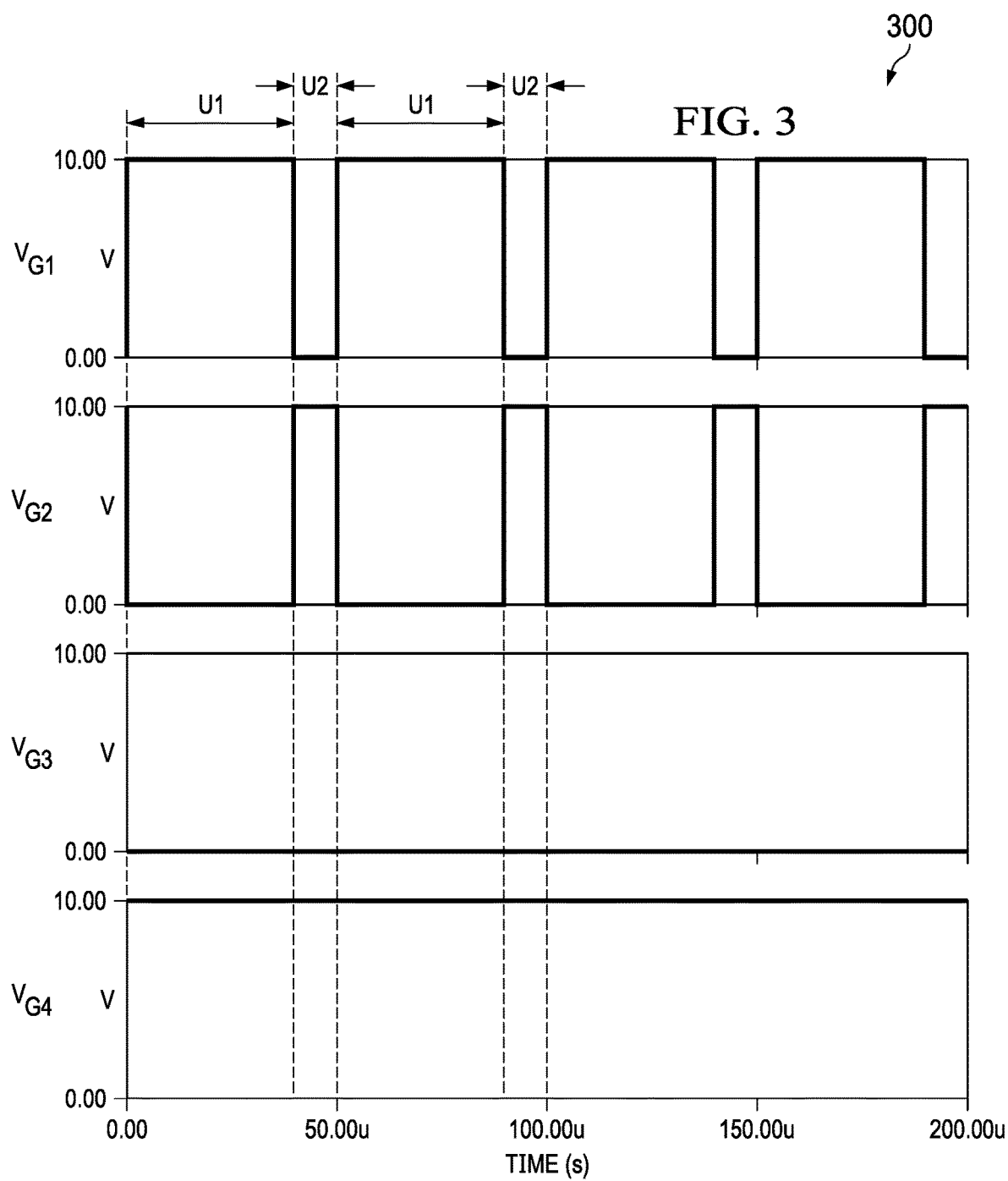
FIG. 3 is a timing diagram showing control signals for a single phase of a trapezoidal control technique in accordance with some examples.

FIG. 3 is a timing diagram 300 showing control signals for one phase (e.g., the active freewheeling interval of FIG. 2) of a trapezoidal control technique in accordance with some examples. In the timing diagram 300, the control signals are $V_{G1}$, $V_{G2}$, $V_{G3}$, and $V_{G4}$, where $V_{G1}$ is the control signal for the high-side switch of a first switch pair, $V_{G2}$ is the control signal for the low-side switch of the first switch pair, $V_{G3}$ is the control signal for the high-side switch of a second switch pair, and $V_{G4}$ is the control signal for the low-side switch of the second switch pair. In the timing diagram 300, $V_{G1}$ is a gate drive signal with a duty-cycle of around 80%, while $V_{G2}$ is a complementary (inverse) gate drive signal with a duty-cycle of around 20%. Meanwhile, $V_{G3}$ stays low and $V_{G4}$ stays high. As shown, during U1 intervals, $V_{G1}$ is high, $V_{G2}$ is low, $V_{G3}$ is low, and $V_{G4}$ is high. During U2 intervals, $V_{G1}$ is low, $V_{G2}$ is high, $V_{G3}$ is low, and $V_{G4}$ is high. The duration for U1 and U2 is a function of the switching frequency and the duty-cycle. In the timing diagram 300, a switching frequency of 20 kHz is represented. In other examples, the duty-cycle and/or the switching frequency varies.

Figure 4A:
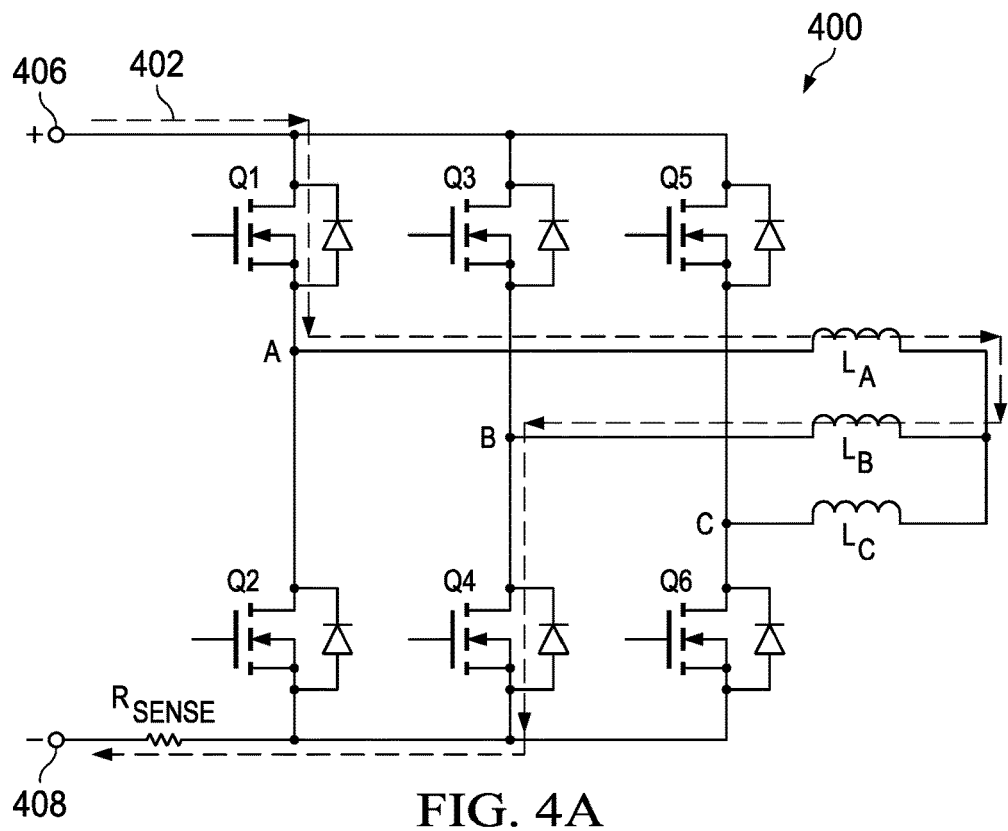
FIGS. 4A and 4B are schematic diagrams showing different current flow scenarios for a three-phase inverter and a motor in accordance with some examples.
Figure 4B:
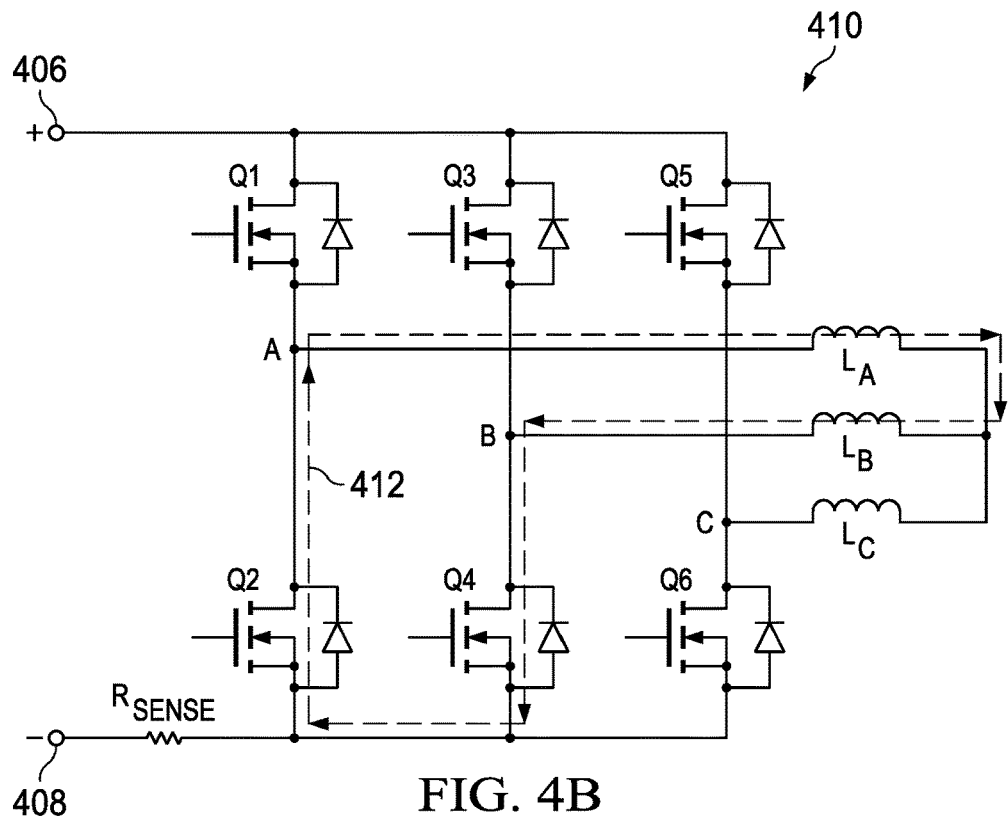

FIGS. 4A and 4B are schematic diagrams showing different current flow scenarios 400 and 410 during the one phase (e.g. phase AB) of a three-phase inverter and a motor in accordance with some examples. In both scenarios 400 and 410, switches Q1-Q6 correspond to three switch pairs respectively between an input voltage node 406 and a ground node 408. More specifically, Q1 and Q2 are a first switch pair with switch node A, Q3 and Q4 are a second switch pair with switch node B, and Q5 and Q6 are a third switch pair with switch node C. As shown, the switch nodes A, B, and C are coupled to a motor represented by inductors, $L_A$, $L_B$, and $L_C$. In scenario 400 of FIG. 4A, current flow 402 passes through Q1, $L_A$, $L_B$, Q4, and $R_{sense}$ as shown, which corresponds to each U1 interval in FIG. 3. In scenario 410 of FIG. 4B, current flow 412 passes through Q2, $L_A$, $L_B$, Q4 as shown, which corresponds to each U2 interval in FIG. 3. The current flows 402 and 412 in FIGS. 4A and 4B correspond to a first phase (e.g., phase AB) with current flow in the first and second switch pairs, while the third switch pair is open. In a subsequent phase, current flow will be in the second and third switch pairs, while the first switch pair is off. In another subsequent phase, current flow will be in the third and first switch pairs, while the second switch pair is off.

Figure 5:
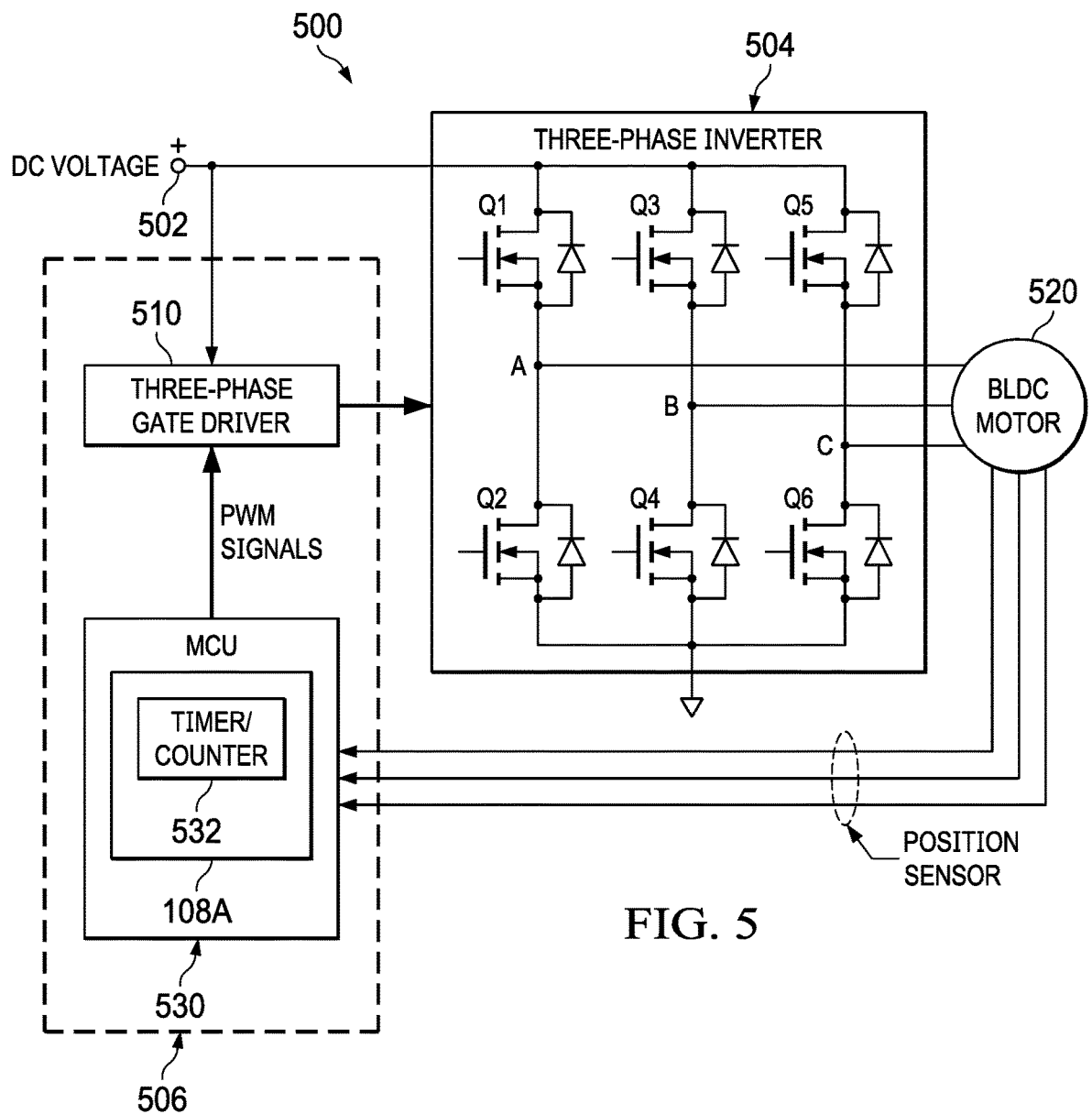
FIG. 5 is a schematic diagram showing an electrical system in accordance with some examples.

FIG. 5 is a schematic diagram showing an electrical system 500 in accordance with some examples. As shown, the electrical system 500 comprises a three-phase inverter 504 with the switches (Q1-Q6) and switch nodes (A, B, C) described in FIGS. 4A and 4B. The switches of the three-phase inverter 504 are directed by control signals from a controller 506 (an example of the controller 106 in FIG. 1). In the example of FIG. 5, the controller 506 includes a three-phase gate driver 510 and a microcontroller (MCU) 530 coupled to the three-phase gate driver 510, where the MCU 530 is configured to provide PWM signals to the three-phase gate driver 510 based on a pulse overlap manager 108A (an example of the pulse overlap manager 108 in FIG. 1). In the example of FIG. 5, the pulse overlap manager 108A includes a timer or counter 532 (e.g., a digital timer or counter components of the MCU 530) to perform pulse generation based on an up-down ramp, an upper threshold, and a lower threshold (see e.g., FIG. 6). With the PWM signals output by the MCU 530, the three-phase gate driver 510 is able to drive the switches of the three-phase inverter 504 to power a BLDC motor 520 in a manner that reduces unequal losses and unequal heating. In this manner, cooling complexities are avoided or reduced. Also, the torque capability at lower speed or duty-cycle is improved compared to the trapezoidal control technique represented in FIGS. 2, 3, 4A, and 4B.

Figure 6:
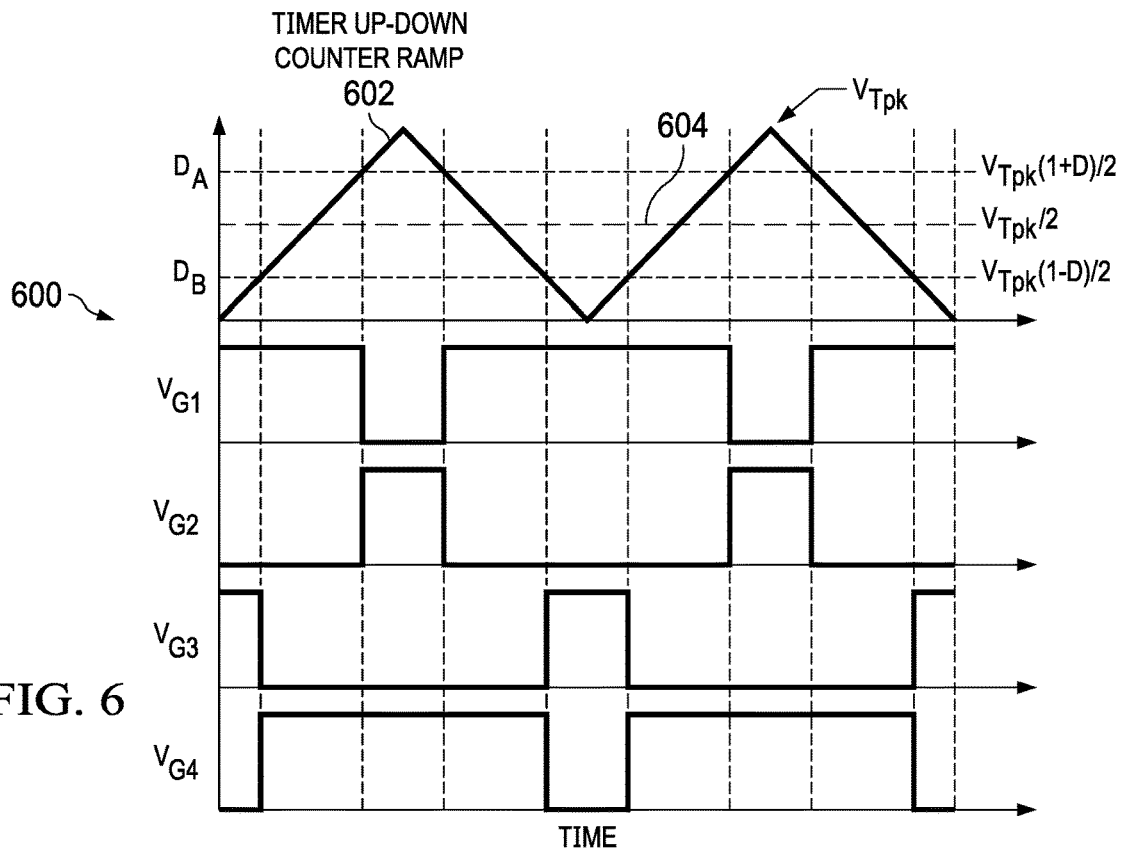
FIG. 6 is a timing diagram showing PWM signals and a counter ramp control signal in accordance with some examples.

FIG. 6 is a timing diagram 600 showing PWM signals and a counter ramp control signal in accordance with some examples. In the timing diagram 600, the counter ramp control signal 602 moves up and down between a peak value ($V_{Tpk}$) and a minimum or start value. As represented in the timing diagram 600, the PWM signals ($V_{G1}$, $V_{G2}$, $V_{G3}$, and $V_{G4}$) are a function of the counter ramp control signal 602 relative to an upper threshold ($D_A$) and a lower threshold ($D_B$). In the example of FIG. 6, $D_A$ and $D_B$ are set relative to $V_{Tpk}/2$ and the required voltage switching duty-cycle (D) of the motor or inverter, such that $D_A$ is set at $0.5*V_{Tpk}$ (1+D). Also, $D_B$ is set relative to $V_{Tpk}/2$ by subtracting D from 1, such that $D_B$ is set at $0.5*V_{Tpk}$ (1−D).

When the counter ramp control signal 602 crosses $D_B$ going up, $V_{G3}$ goes low and $V_{G4}$ goes high. Later, when the counter ramp control signal 602 crosses $D_A$ going up, $V_{G1}$ goes low and $V_{G2}$ goes high. Eventually, the counter ramp control signal 602 reaches $V_{Tpk}$ and starts to fall. When the counter ramp control signal 602 reaches $D_A$ going down, $V_{G1}$ goes high and $V_{G2}$ goes low. Later, when the counter ramp control signal 602 crosses $D_B$ going down, $V_{G3}$ goes high and $V_{G4}$ goes low. The same pattern (referred to as a pulse overlap pattern) is repeated once the counter ramp control signal 602 reaches its minimum or start value. As represented in FIG. 6, the pulse overlap pattern corresponds to a first set of PWM control signals and a second set of PWM control signals, where the first set of PWM control signals is phase-shifted relative to the second set of PWM control signals. With the first and second sets of PWM control signals, respective first and second sets of gate drive signals are generated by gate driver circuitry (e.g., the gate driver circuitry 110 in FIG. 1, or the three-phase gate driver 510 in FIG. 5) to control Q1-Q4 in a given phase (e.g. phase AB).

Compared to the trapezoidal control technique, the pulse overlap control technique corresponding to FIGS. 5 and 6 does not have a low-side switch (e.g., Q4) conducting continuously for 120 degrees. Instead, the pulse overlap control technique has a low-side switch (e.g., Q4) of one switch pair with the same switching frequency as the high-side switch (e.g., Q1) of another switch pair. So there is freewheeling periods between the two low-side switches (e.g., Q2 and Q4) and also between the two high-side switches (e.g., Q1 and Q3). In comparison, the control technique corresponding to FIGS. 2, 3, 4A, and 4B, has freewheeling only between the low-side switches.

With the proposed pulse overlap control technique, the high-side and low-side switches that conduct during each 120 degree period of positive and negative motor current are switched. To keep switching losses the same as the trapezoidal control technique, the proposed pulse overlap control technique uses a reduced switching frequency (e.g., half the switching frequency compared to the switching frequency of the existing trapezoidal control technique in FIGS. 2, 3, 4A, and 4B), even though both the low-side and high-side switches are switching during 120 degree positive winding current interval and 120 degree negative winding current interval, the use of half the switching frequency ensures that the total switching loss is same as existing trapezoidal control method. Also, with the proposed pulse overlap control technique, the PWM signals are phase-shifted between phases so that motor winding voltage switches at double the switching frequency, giving the same motor current ripple and performance as the existing trapezoidal control technique.

Figure 7:
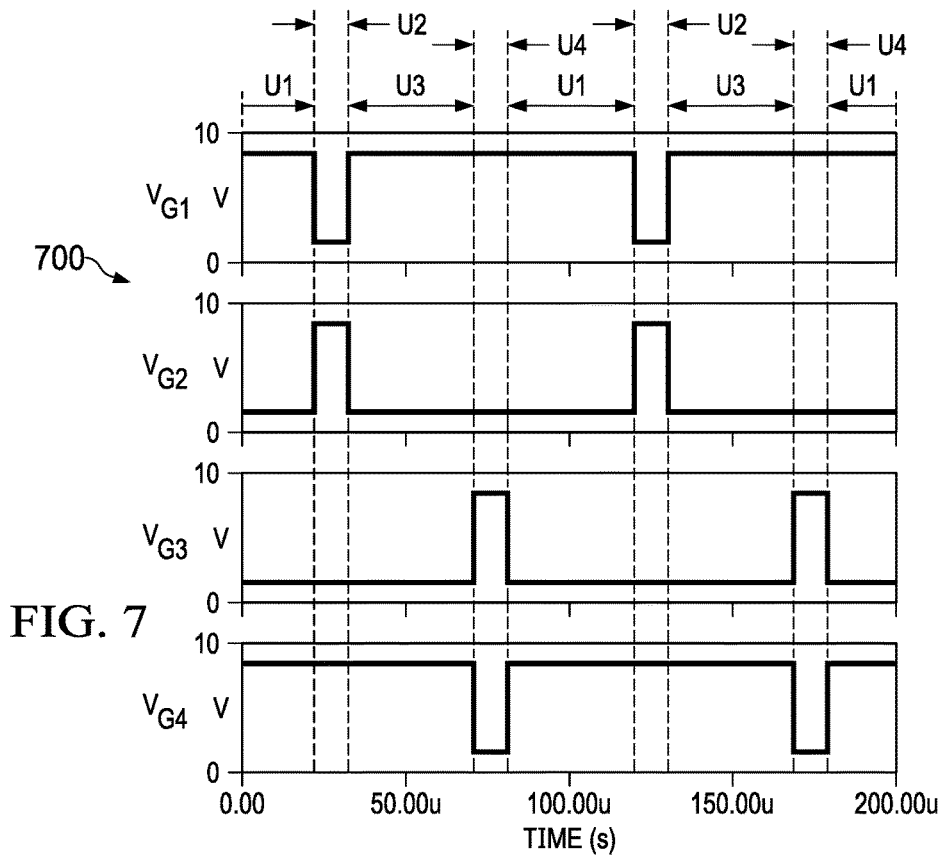
FIG. 7 is a timing diagram showing control signals for a single phase of a pulse overlap control technique in accordance with some examples.

FIG. 7 is a timing diagram 700 showing control signals for one phase (e.g. phase AB) of a pulse overlap control technique in accordance with some examples. In the timing diagram 700, the control signals are $V_{G1}$, $V_{G2}$, $V_{G3}$, and $V_{G4}$, where $V_{G1}$ is the control signal for the high-side switch of a first switch pair, $V_{G2}$ is the control signal for the low-side switch of the first switch pair, $V_{G3}$ is the control signal for the high-side switch of a second switch pair, and $V_{G4}$ is the control signal for the low-side switch of the second switch pair. In the timing diagram 700, $V_{G1}$ is a PWM signal with a duty-cycle of around 80%, while $V_{G2}$ is a complementary (inverse) PWM signal with a duty-cycle of around 20%. Meanwhile, $V_{G3}$ has the same duty-cycle as $V_{G2}$ and is phase-shifted relative to $V_{G2}$. Also, $V_{G4}$ has the same duty-cycle as $V_{G1}$ and is phase-shifted relative to $V_{G1}$. The control signals of FIG. 7 are obtained using the control technique explained in FIG. 6.

As shown, the pulse overlap control technique related to the timing diagram 700 includes a repeating pattern of control signals corresponding to a U1 interval, a U2 interval, a U3 interval, and a U4 interval. During the U1 intervals $V_{G1}$ is high, $V_{G2}$ is low, $V_{G3}$ is low, and $V_{G4}$ is high. During the U2 interval, $V_{G1}$ is low, $V_{G2}$ is high, $V_{G3}$ is low, and $V_{G4}$ is high. During the U3 interval, $V_{G1}$ is high, $V_{G2}$ is low, $V_{G3}$ is low, and $V_{G4}$ is high. During the U4 interval, $V_{G1}$ is high, $V_{G2}$ is low, $V_{G3}$ is high, and $V_{G4}$ is low. In the example of FIG. 7, the duration for U1 and U3 is the same and is a function of the switching frequency and the duty-cycle. Also, the duration for U2 and U4 is the same and is a function of the switching frequency and the duty-cycle. In the timing diagram 700, a switching frequency of 10 kHz is represented. In other examples, the duty-cycle and/or the switching frequency varies.

Figure 8:
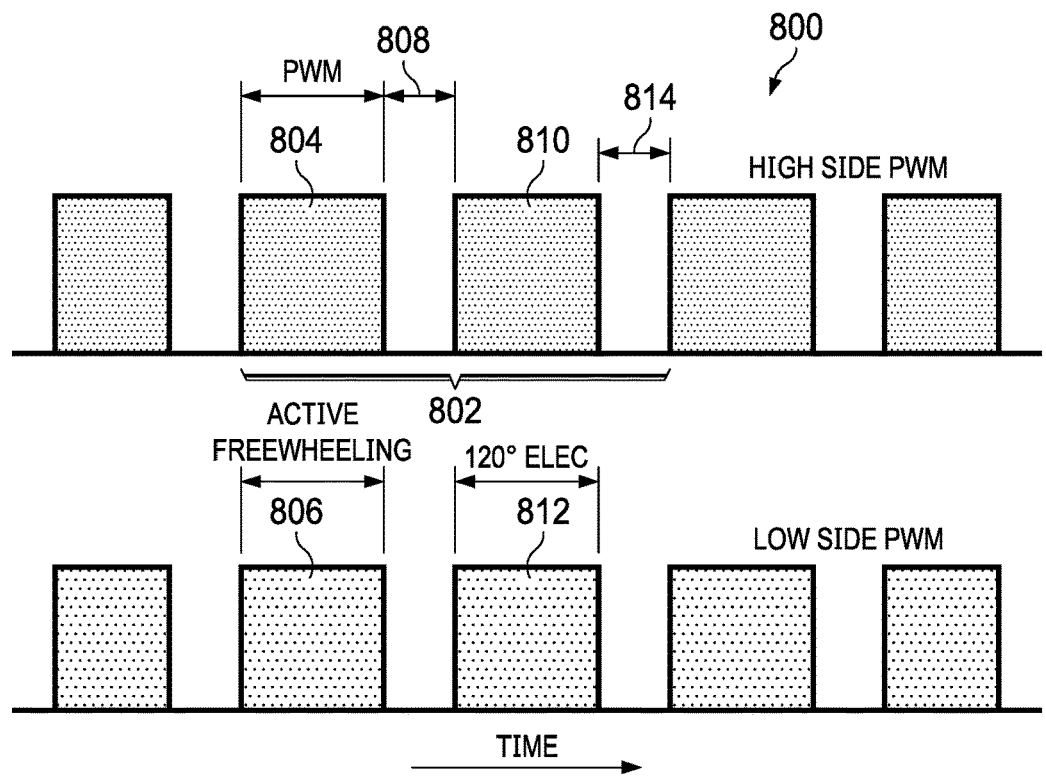
FIG. 8 is a timing diagram showing PWM signals of a pulse overlap control technique over multiple control cycles for a switch pair of a half-bridge of a brushless DC motor in accordance with some examples.
Figure 9A:
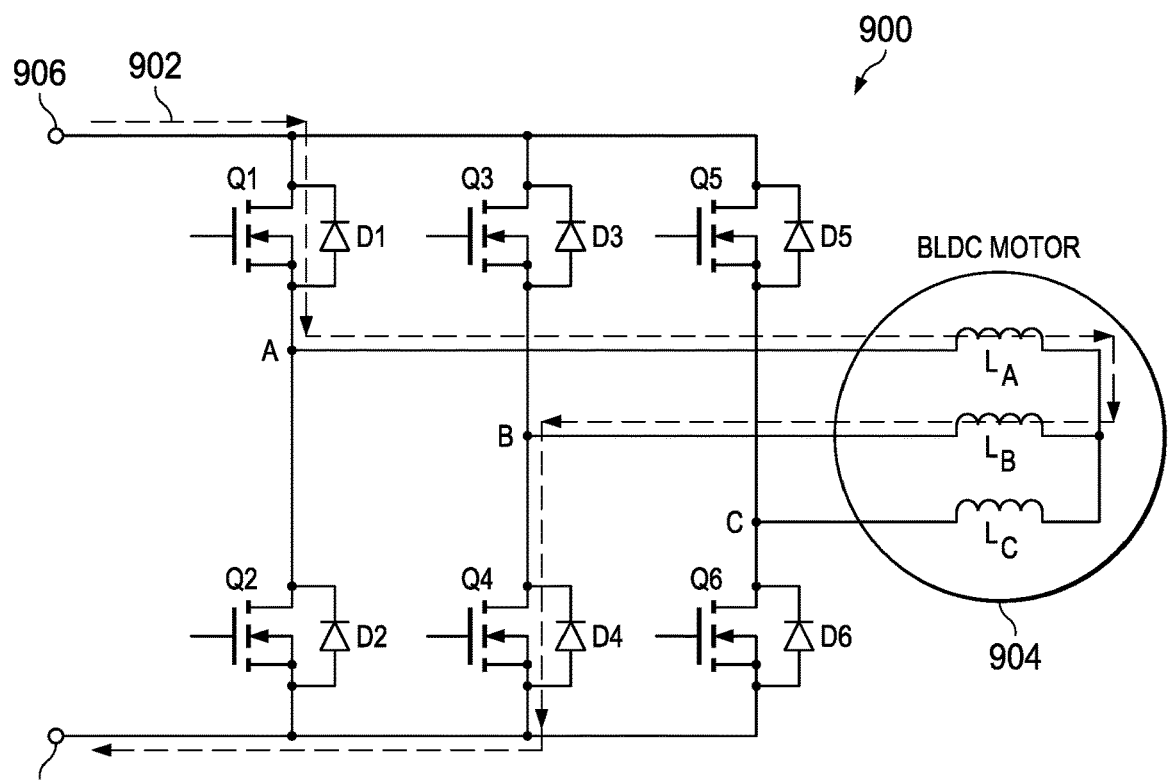
FIGS. 9A-9D are schematic diagrams showing different current flow scenarios for a three-phase inverter and a motor in accordance with some examples.
Figure 9B:
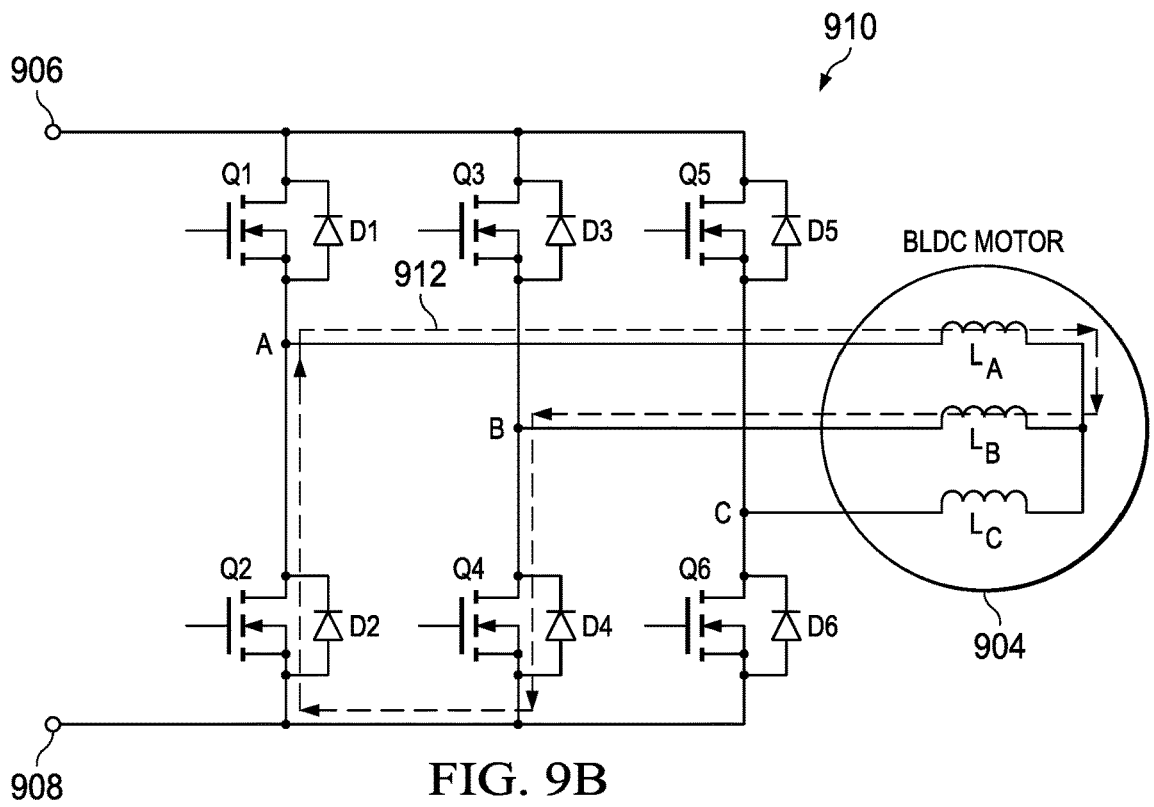
Figure 9C:
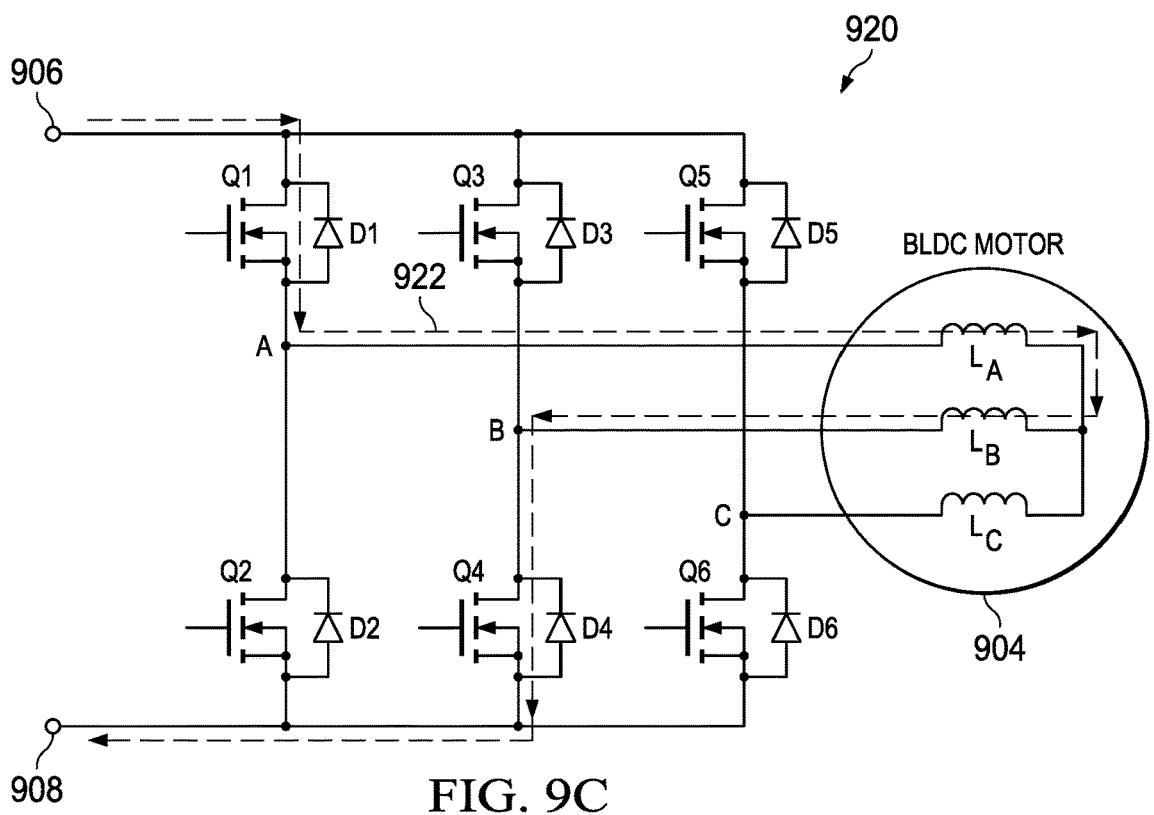
Figure 9D:
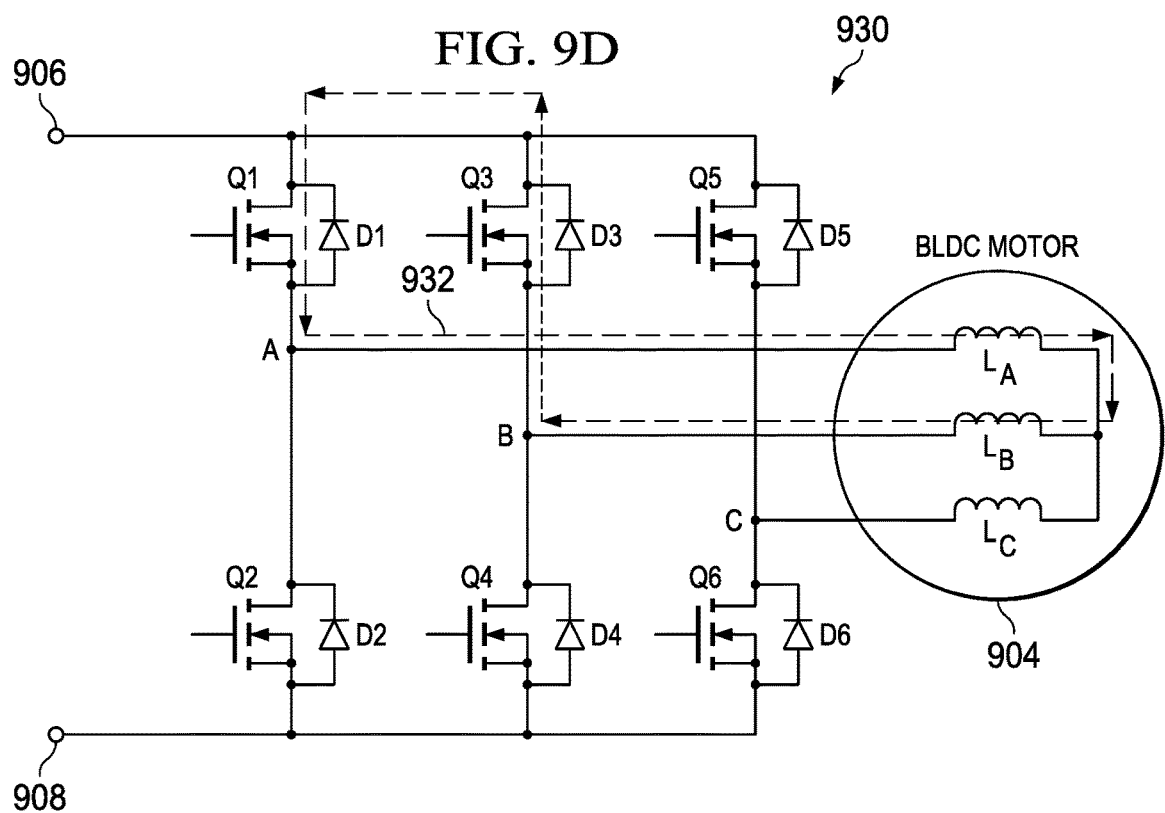

FIG. 8 is a timing diagram 800 showing PWM signals of a pulse overlap control technique over multiple control cycles for a switch pair of a half-bridge of a brushless DC motor in accordance with some examples. In the timing diagram 800, interval 802 corresponds to one control cycle, where the control cycle includes high-side and low-side active freewheeling intervals 804 and 806 to generate positive current into a motor winding (e.g., current flows into $L_A$). As an example, the control signals ($V_{G1}$ and $V_{G2}$) represented in the timing diagram 700 of FIG. 7, correspond to the first set of high-side and low-side active freewheeling intervals 804 and 806. In one example, the high-side switch conducts at an 80% duty-cycle and the low-side switch conducts at a 20% duty-cycle in the active freewheeling intervals 804 and 806. After the high-side and low-side freewheeling intervals 804 and 806, there is a pause interval 808 with no switching activity. After the pause interval 808, there is a second set of high-side and low-side switching (active freewheeling) intervals 810 and 812 to generate negative current out of the motor winding (e.g., current flows out of $L_A$). In one example, the high-side switch conducts at a 20% duty-cycle and the low-side switch conducts at an 80% duty-cycle in the active freewheeling intervals 810 and 812. For each subsequent control cycle, the switching repeats with the demanded duty-cycle.

FIGS. 9A-9D are schematic diagrams showing different current flow scenarios 900, 910, 920, and 930 for a three-phase inverter and a motor in accordance with some examples. In all of the scenarios 900, 910, 920, and 930, switches Q1-Q6 correspond to three switch pairs respectively between an input voltage node 906 and a ground node 908. More specifically, Q1 and Q2 are a first switch pair with switch node A, Q3 and Q4 are a second switch pair with switch node B, and Q5 and Q6 are a third switch pair with switch node C. As shown, the switch nodes A, B, and C are coupled to a motor 904 represented by inductors, $L_A$, $L_B$, and $L_C$. In scenario 900 of FIG. 9A, current flow 902 passes through Q1, $L_A$, $L_B$, and Q4 as shown, which corresponds to each U1 interval in FIG. 7. In scenario 910 of FIG. 9B, current flow 912 passes through Q2, $L_A$, $L_B$, and Q4 as shown, which corresponds to each U2 interval in FIG. 7. In scenario 920 of FIG. 9C, current flow 922 passes through Q1, $L_A$, $L_B$, and Q4 as shown, which corresponds to each U3 interval in FIG. 7. In scenario 930 of FIG. 9D, current flow 932 passes through Q1, $L_A$, $L_B$, and Q3 as shown, which corresponds to each U4 interval in FIG. 7.

The current flows 902, 912, 922 and 932 in FIGS. 9A-9D correspond to positive current in motor winding $L_A$ and negative current in motor winding $L_B$. Specifically, the current flows 902, 912, 922, and 932 in FIGS. 9A-9D correspond to a first phase (e.g., phase AB) with current flow controlled by the first and second switch pairs, while the third switch pair is open. During control phase BA (not shown in FIGS. 9A-9D), Q1-Q4 are controlled so that $L_B$ carries positive current and $L_A$ carries negative current. During control phase AC, Q1, Q2, Q5, and Q6 are controlled so that $L_A$ carries positive current and $L_C$ carries negative current. During control phase CA, Q1, Q2, Q5, and Q6 are controlled so that $L_C$ carries positive current and $L_A$ carries negative current. During control phase BC, Q3-Q6 are controlled so that $L_B$ carries positive current and $L_C$ carries negative current. During control phase CB, Q3-Q6 are controlled so that $L_C$ carries positive current and $L_B$ carries negative current.

With the current flows 902, 912, 922, and 932 represented in scenarios 900, 910, 920, and 930 of FIGS. 9A-9D, the high-side and low-side switches of a switch pair will stay on for an equal amount on average over a complete control cycle (e.g. with AB, AC, BC, BA, CA, CB phases), resulting in equalized losses and heating, which reduces the need for cooling complexity. Also, impairment of the torque capability at lower speed or duty-cycle is reduced or avoided.

Figure 10:
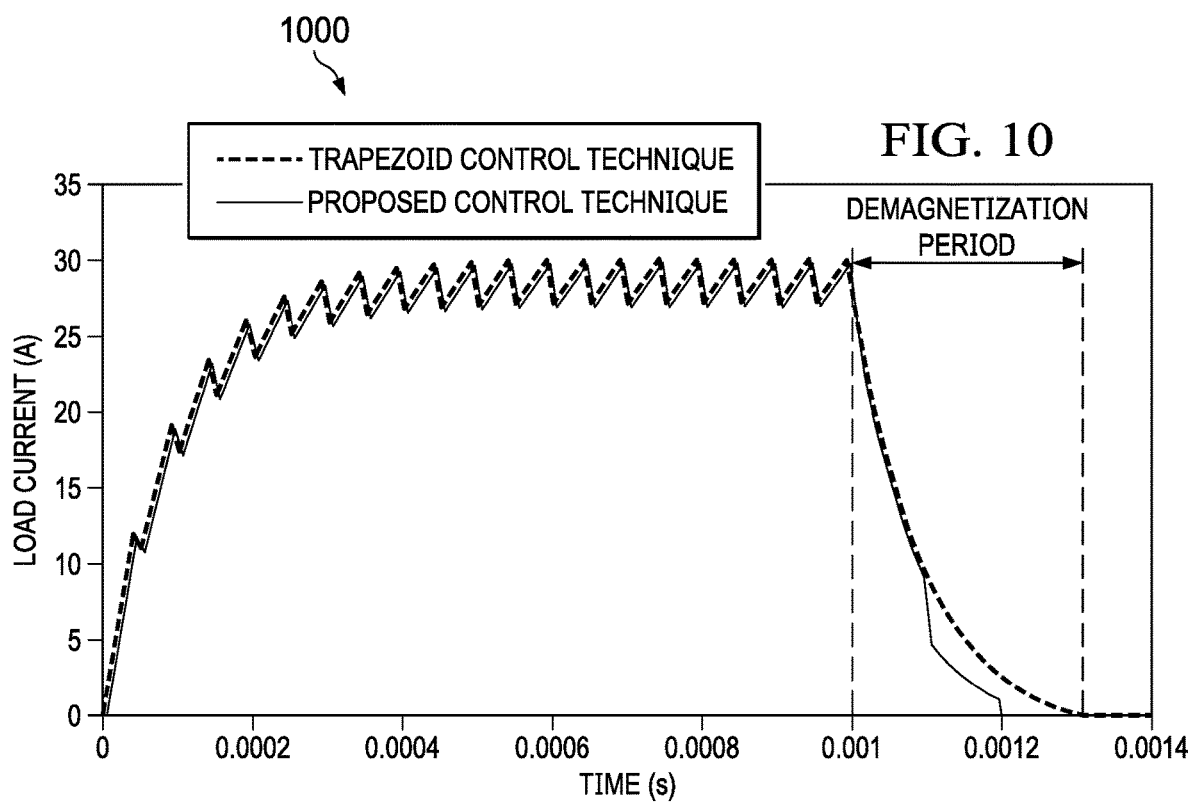
FIG. 10 is a timing diagram showing load current of a motor with and without the proposed pulse overlap technique in accordance with some examples.

FIG. 10 is a timing diagram 1000 showing load current of a motor with and without the proposed pulse overlap technique in accordance with some examples. As shown in the timing diagram 1000, the effective motor current switching frequency using the proposed pulse overlap technique is same as the trapezoidal control technique (trapezoid control technique) ensuring same winding current ripple, even though the proposed pulse overlap technique switches the switches at half the switching frequency compared to trapezoidal control technique. Also, the proposed pulse overlap technique ensures that the winding demagnetizes faster compared to trapezoidal control technique, which reduces motor torque ripple. As shown, the winding current during demagnetization has a faster slop with proposed pulse overlap technique compared to the trapezoidal control technique. This is because of the winding current re-generating back to DC bus capacitor as represented in FIG. 11.

Figure 11:
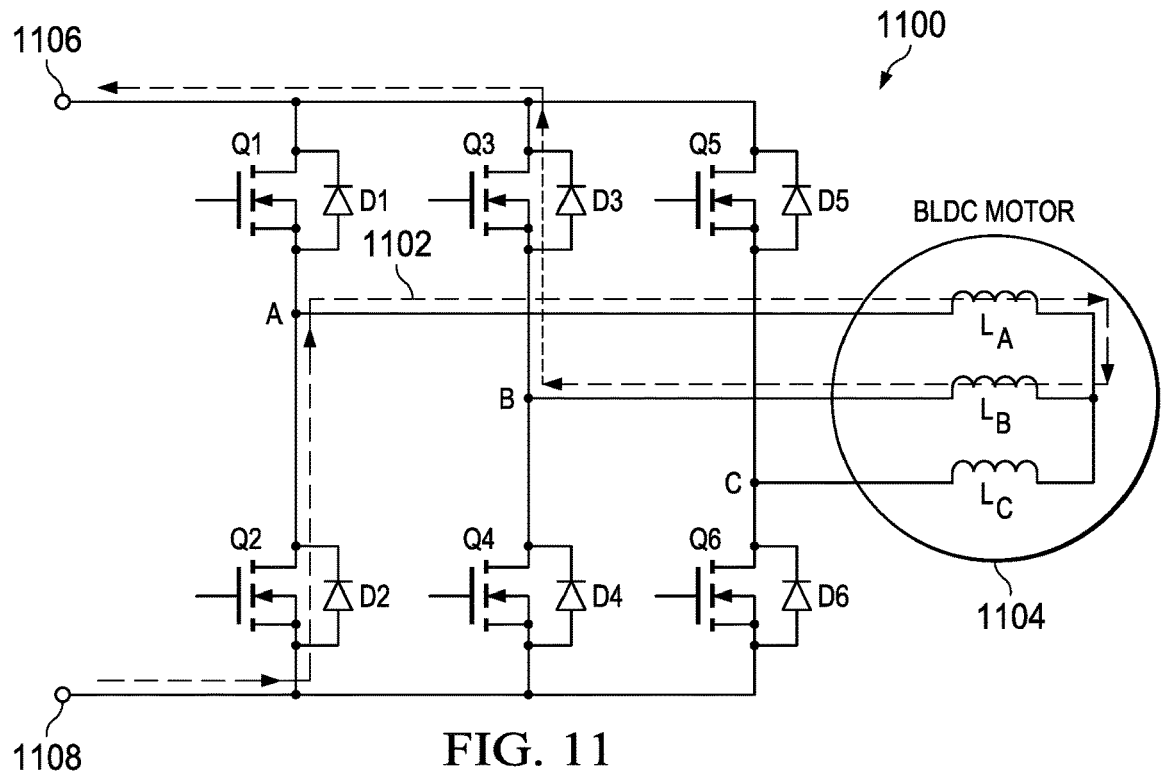
FIG. 11 is a schematic diagram showing current flow scenario for phase A regeneration in a three-phase inverter and a motor during a demagnification period scenarios in accordance with some examples.

FIG. 11 is a schematic diagram showing a current flow scenario 1100 for phase A regeneration in a three-phase inverter and a motor during a demagnification period scenarios in accordance with some examples. In scenarios 1100, switches Q1-Q6 correspond to three switch pairs respectively between an input voltage node 1106 and a ground node 1108. More specifically, Q1 and Q2 are a first switch pair with switch node A, Q3 and Q4 are a second switch pair with switch node B, and Q5 and Q6 are a third switch pair with switch node C. As shown, the switch nodes A, B, and C are coupled to a motor 1104 represented by inductors, $L_A$, $L_B$, and $L_C$. In scenario 1100 of FIG. 11, current flow 1102 passes through Q2, $L_A$, $L_B$, and Q3 as shown. For example, if winding $L_A$ (current flow 1102 in FIG. 11) is demagnetizing, then both the high-side and low-side switches of phase A are off. With a Phase A positive current flow, there is current flow 1102 through the low-side switch diode of the phase A half-bridge. This current flow 1102 completes the path through the low-side switch of Phase B (freewheeling). However, when the low-side switch of phase B turns off and the high-side switch of Phase B turns on, the Phase A demagnetization current regenerates to the DC bus through the high-side switch of Phase B as represented FIG. 11. The demagnetization by regenerating to the DC bus cause to the $L_A$ winding (Phase A) current to decay faster compared to freewheeling.

Figure 12:
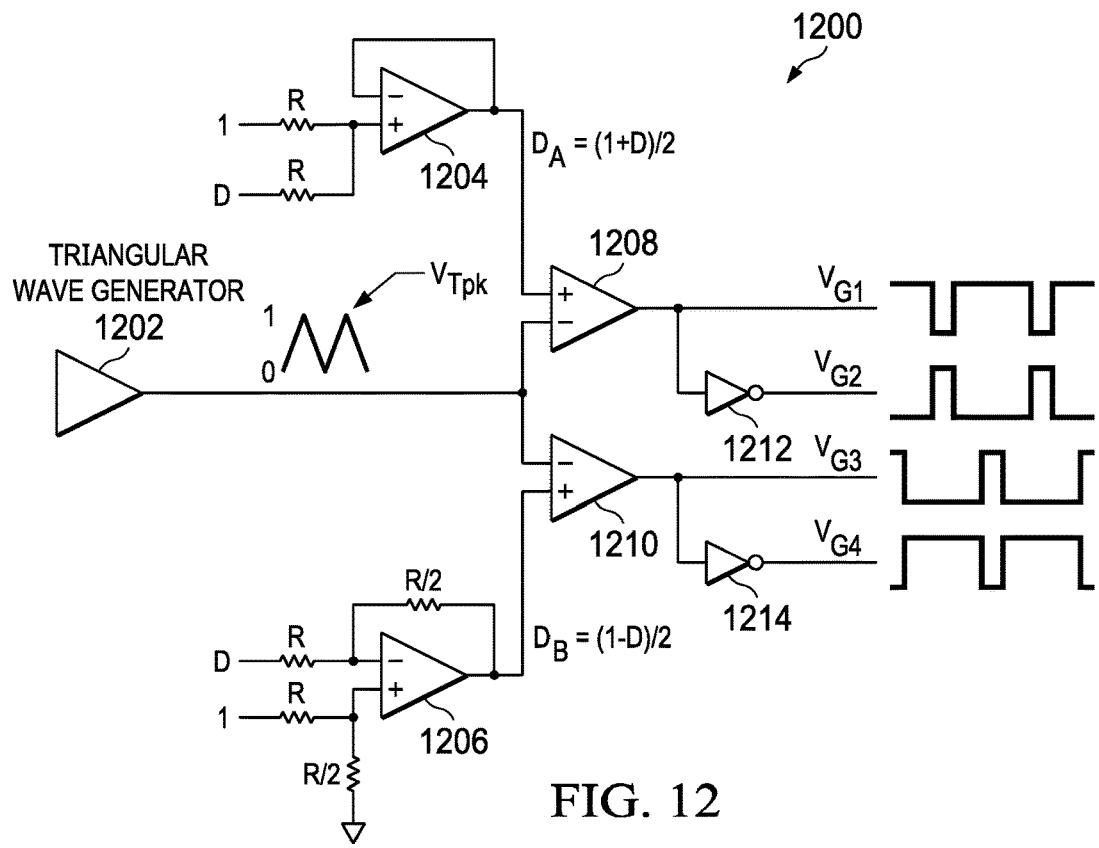
FIG. 12 is a schematic diagram showing a controller to provide pulse overlap control in accordance with some examples.

FIG. 12 is a schematic diagram showing a controller 1200 (an example of the controller 106 in FIG. 1) to provide pulse overlap control in accordance with some examples. The controller 1200 is an alternative option to the MCU-based option described in FIG. 5. In some examples, the controller 1200 includes a triangular wave generator 1202 configured to generate a triangular wave based on a $V_{Tpk}$ value. For further analysis, the $V_{Tpk}$ value is set to 1, which means the triangular wave ramp up and down between 0 and 1. The output of the triangular wave generator 1202 is provided to negative inputs of a first comparator 1208 and a second comparator 1210, which corresponds to analog comparators in some examples. The positive input of the first comparator 1208 is provided by a first operational amplifier 1204 configured to provide a reference value for $D_A$, where $D_A$ is set to $D_A=(1+D)/2$, where D is the voltage switching duty-cycle of the motor connected to the three phase inverter power stage. To generate $D_A$, the first operational amplifier 1204 has a negative feedback loop. Also, the positive input of the first operational amplifier 1204 is set using resistors and appropriate voltage values to represent the value $(1+D)/2$. For example, to get a motor voltage switching duty-cycle (D) of 0.6, the value of DA is set to 0.8.

As represented in FIG. 12, the positive input of the second comparator 1210 is provided a second operational amplifier 1204 configured to provide a reference value for $D_B$, where $D_B$ is set to $D_B=(1-D)/2$. For example, to get a motor voltage switching duty-cycle (D) of 0.6, the value of DB is set to 0.2. To generate $D_B$, the second operational amplifier 1206 has a negative feedback loop with a resistance value of R/2. The negative input of the second operational amplifier 1206 is also coupled to a voltage (representing D) via a resistor (R). Also, the positive input of the second operational amplifier 1206 is set using resistors R and R/2 in a voltage divider arrangement, where the input to the voltage divider arrangement is represented by a "1". In the example of FIG. 12, the output of the first comparator 1208 corresponds to $V_{G1}$, where a first inverter 1212 is used to generate $V_{G2}$ from $V_{G1}$. Also, the output of the second comparator 1210 corresponds to $V_{G3}$, where a second inverter 1214 is used to generate $V_{G4}$ from $V_{G3}$. Note: during the 60 degree phase where both the high-side and low-side switches connected to the node A are off, the control signals coming from the $V_{G1}$ and $V_{G2}$ paths of the controller 1200 are not connected to the gate driver circuitry. In some examples, a respective switch (not shown) for each of the $V_{G1}$ and $V_{G2}$ paths are used to stop $V_{G1}$ and $V_{G2}$ from being provided to the gate driver circuitry. Similar switches (not shown) could be used along the $V_{G3}$ and $V_{G4}$ paths to selectively control when $V_{G3}$ and $V_{G4}$ is provided to gate driver circuitry. In other examples, the gate driver circuitry itself includes switches to selectively disable $V_{G1}$-$V_{G4}$ paths for respective 60 degree off periods. Also, it should be appreciated that the controller 1200 is able to generate $V_{G5}$ and $V_{G6}$ using that same components or similar components as those represented in FIG. 12. Also, switches for the $V_{G5}$ and $V_{G6}$ paths and/or switch of the gate driver circuitry are able to selectively prevent propagation of the $V_{G5}$ and $V_{G6}$ signals for 60 degree off period.

Figure 13:
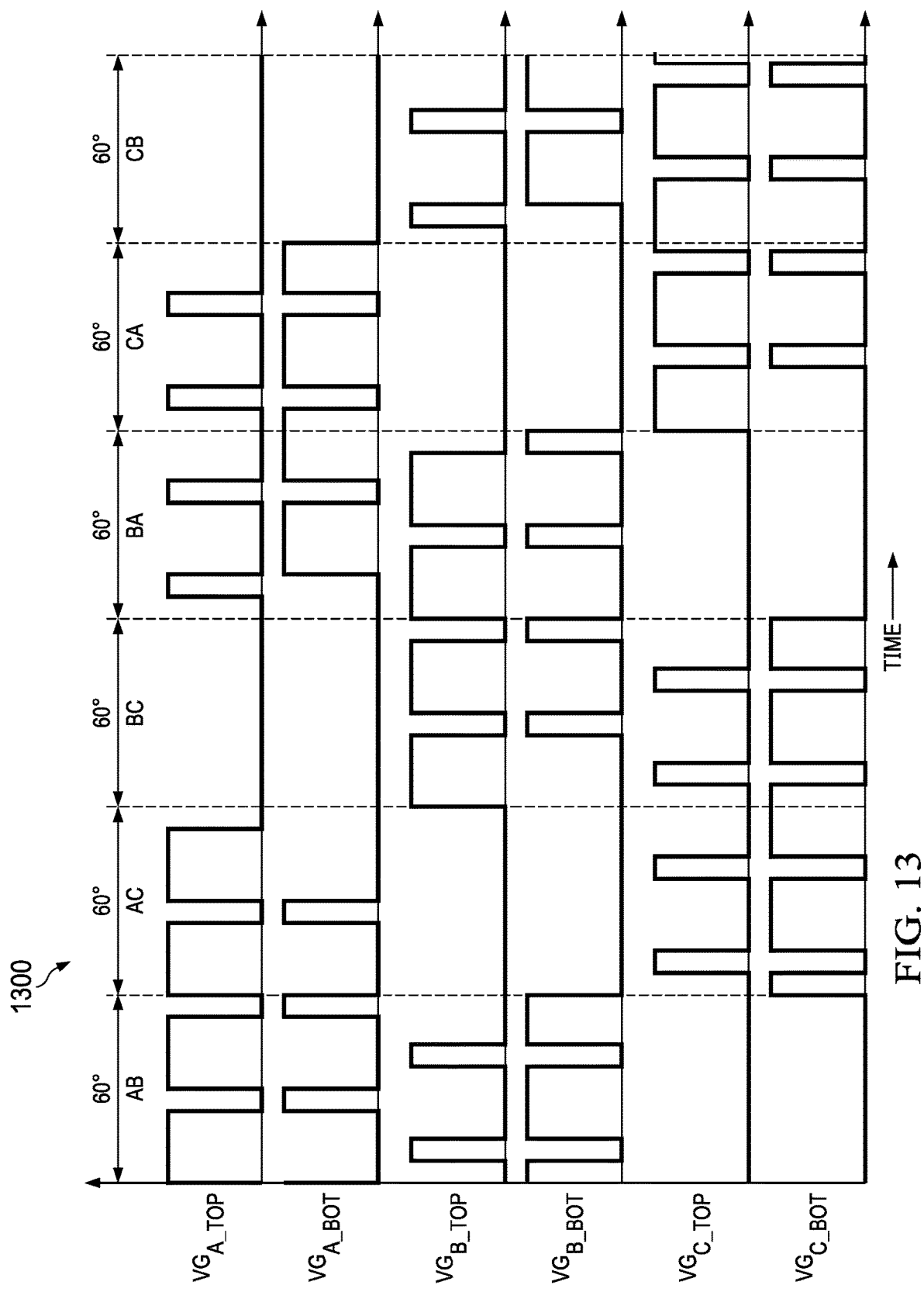
FIG. 13 is a timing diagram showing PWM signals for different phases of a control cycle in accordance with some examples.

FIG. 13 is a timing diagram 1300 showing gate drive signals for different phases (e.g., AB, AC, BC, BA, CA, and CB) of a control cycle in accordance with some examples. In the example of FIG. 13, there are six control signals, $VG_{A\_TOP}$, $VG_{A\_BOT}$, $VG_{B\_TOP}$, $VG_{B\_BOT}$, $VG_{C\_TOP}$, and $VG_{C\_BOT}$. Specifically, $VG_{A\_TOP}$ is the control signal for the high-side switch (e.g., Q1) of a first switch pair corresponding to phase A, $VG_{A\_BOT}$ is the control signal for the low-side switch (e.g., Q2) of the first switch pair corresponding to phase A, $VG_{B\_TOP}$ is the control signal for the high-side switch (e.g., Q3) of a second switch pair corresponding to phase B, $VG_{B\_BOT}$ is the control signal for the low-side switch (e.g., Q4) of the second switch pair corresponding to phase B, $VG_{C\_TOP}$ is the control signal for the high-side switch (e.g., Q5) of a third switch pair corresponding to phase C, and $VG_{C\_BOT}$ is the control signal for the low-side switch (e.g., Q6) of the third switch pair corresponding to phase C.

In phase AB (a first 60 degree interval of a 360 degree control cycle), $VG_{A\_TOP}$ is a gate drive signal with a first duty-cycle (e.g., 80%) and $VG_{A\_BOT}$ is a gate drive signal with a second duty-cycle (e.g., 20%) complementary to the first duty-cycle. Also, $VG_{B\_TOP}$ is a gate drive signal with the second duty-cycle (e.g., 20%), where $VG_{B\_TOP}$ is phase-shifted relative to $VG_{A\_BOT}$. Also, $VG_{B\_BOT}$ is a gate drive signal with the first duty-cycle (e.g., 80%), where $VG_{B\_BOT}$ is phase-shifted relative to $VG_{A\_TOP}$. In phase AB, $VG_{C\_TOP}$ and $VG_{C\_BOT}$ are not used.

In phase AC (a second 60 degree interval of a 360 degree control cycle), $VG_{A\_TOP}$ and $VG_{A\_BOT}$ are the same as in phase AB. Also, $VG_{C\_TOP}$ is a gate drive signal with the second duty-cycle (e.g., 20%), where $VG_{C\_TOP}$ is phase-shifted relative to $VG_{A\_BOT}$. Also, $VG_{C\_BOT}$ is a gate drive signal with the first duty-cycle (e.g., 80%), where $VG_{C\_BOT}$ is phase-shifted relative to $VG_{A\_TOP}$. In phase AC, $VG_{B\_TOP}$ and $VG_{B\_BOT}$ are not used.

In phase BC (a third 60 degree interval of a 360 degree control cycle), $VG_{B\_TOP}$ is a gate drive signal with a first duty-cycle (e.g., 80%) and $VG_{B\_BOT}$ is a gate drive signal with a second duty-cycle (e.g., 20%) complementary to the first duty-cycle. Also, $VG_{C\_TOP}$ and $VG_{C\_BOT}$ stay the same as in phase AC. In phase BC, $VG_{A\_TOP}$ and $VG_{A\_BOT}$ are not used.

In phase BA (a fourth 60 degree interval of a 360 degree control cycle), $VG_{B\_TOP}$ and $VG_{B\_BOT}$ stay the same as in phase BC. Also, $VG_{A\_TOP}$ is a gate drive signal with the second duty-cycle (e.g., 20%), where $VG_{A\_TOP}$ is phase-shifted relative to $VG_{B\_BOT}$. Also, $VG_{A\_BOT}$ is a gate drive signal with the first duty-cycle (e.g., 80%), where $VG_{A\_BOT}$ is phase-shifted relative to $VG_{B\_TOP}$. In phase BA, $VG_{C\_TOP}$ and $VG_{C\_BOT}$ are not used.

In phase CA (a fifth 60 degree interval of a 360 degree control cycle), $VG_{C\_TOP}$ is a gate drive signal with a first duty-cycle (e.g., 80%) and $VG_{C\_BOT}$ is a gate drive signal with a second duty-cycle (e.g., 20%) complementary to the first duty-cycle. Also, $VG_{A\_TOP}$ and $VG_{A\_BOT}$ stay the same as in phase BA. In phase CA, $VG_{B\_TOP}$ and $VG_{B\_BOT}$ are not used.

In phase CB (a sixth 60 degree interval of a 360 degree control cycle), $VG_{C\_TOP}$ and $VG_{C\_BOT}$ stay the same as in phase CA. Also, $VG_{B\_TOP}$ is a PWM signal with the second duty-cycle (e.g., 20%), where $VG_{B\_TOP}$ is phase-shifted relative to $VG_{C\_BOT}$. Also, $VG_{B\_BOT}$ is a PWM signal with the first duty-cycle (e.g., 80%), where $VG_{B\_BOT}$ is phase-shifted relative to $VG_{C\_TOP}$. In phase CB, $VG_{A\_TOP}$ and $VG_{A\_BOT}$ are not used.

In some examples, a multiphase switching converter (e.g., converter 104 in FIG. 1) includes gate driver circuitry (e.g., the gate driver circuitry 110 in FIG. 1). The multiphase switching converter also includes a controller (e.g., the controller 106 in FIG. 1, or the controller 1200 in FIG. 12) coupled to the gate driver circuitry, where the controller includes a first pulse generation path (e.g., the triangular wave generator 1202 and the first comparator 1208 in FIG. 12) configured to generate a first high-side control signal (e.g., $V_{G1}$) with a first duty-cycle. The controller also includes a second pulse generation path (e.g., the triangular wave generator 1202, the first comparator 1208, and the first inverter 1212 in FIG. 12) configured to generate a first low-side control signal (e.g., $V_{G2}$) with a complementary duty-cycle relative to the first duty-cycle. The controller also includes a third pulse generation path (e.g., the triangular wave generator 1202 and the second comparator 1210 in FIG. 12) configured to generate a second high-side control signal (e.g., $V_{G3}$) with the complementary duty-cycle. The controller also includes a fourth pulse generation path (e.g., the triangular wave generator 1202, the second comparator 1210, and the second inverter 1214 in FIG. 12) configured to generate a second low-side control signal (e.g., $V_{G4}$) with the first duty-cycle. The second high-side control signal (e.g., $V_{G3}$) is phase-shifted relative to the first low-side control signal (e.g., $V_{G2}$). Also, the second low-side control signal (e.g., $V_{G4}$) is phase-shifted relative to the first high-side control signal (e.g., $V_{G1}$).

In some examples, the first pulse generation path includes a triangular wave generator (e.g., the triangular wave generator 1202 in FIG. 12) and an analog comparator (e.g., the first comparator 1208 in FIG. 12) with a first input and a second input. The first input of the analog comparator is coupled to an output of the triangular wave generator, and the second input of the analog comparator is coupled to an upper duty-cycle reference threshold (e.g., $D_A$ in FIG. 12). In some examples, the second pulse generation path includes the triangular wave generator, the analog comparator, and an inverter (e.g., the first inverter 1212 in FIG. 12) coupled to an output of the analog comparator. In some examples, the upper duty-cycle reference threshold is provided by an operational amplifier (e.g., the first operational amplifier 1204) configured to set the upper duty-cycle reference threshold to $(1+D)/2$, where D is a target duty-cycle (e.g., a target voltage switching duty cycle of the motor).

In some examples, the third pulse generation path includes a triangular wave generator (e.g., the triangular wave generator 1202 in FIG. 12) and an analog comparator (e.g., the second comparator 1210 in FIG. 12) with a first input and a second input. The first input of the analog comparator is coupled to an output of the triangular wave generator, and the second input of the analog comparator is coupled to a lower duty-cycle reference threshold (e.g., $D_B$ in FIG. 12). In some examples, the fourth pulse generation path includes the triangular wave generator, the analog comparator, and an inverter (e.g., the second inverter 1214 in FIG. 12) coupled to an output of the analog comparator. In some examples, the lower duty-cycle reference threshold is provided by an operational amplifier (e.g., the second operational amplifier 1206) configured to set the lower duty-cycle reference threshold to $(1-D)/2$, where D is a target duty-cycle.

In some examples, the multiphase switching converter includes a first switch pair (e.g., a phase A pair) with a high-side switch (e.g., Q1) and a low-side switch (e.g., Q2). The multiphase switching converter also includes a second switch pair (e.g., a phase B pair) with a high-side switch (e.g., Q3) and a low-side switch (e.g., Q4). The multiphase switching converter also includes a third switch pair (e.g., a phase C pair) with a high-side switch (e.g., Q5) and a low-side switch (e.g., Q6), where the first, second, and third switch pairs are coupled to the gate driver circuitry. The gate driver circuitry is configured to provide a first set of gate drive signals to one of the first, second, and third switch pairs based on the first high-side control signal (e.g., $V_{G1}$) and the first low-side control signal (e.g., $V_{G2}$). The gate driver circuitry is configured to provide a second set of gate drive signals to another of the first, second, and third switch pairs based on the second high-side control signal (e.g., $V_{G3}$) and the second low-side control signal (e.g., $V_{G4}$). In some examples, the controller is configured to direct the gate driver circuitry to provide the first set of gate drive signals and the second set of gate drive signals to each of the first, second, and third switch pairs in different 120 degree intervals of a 360 degree control cycle, wherein the different 120 degree intervals are spaced from each other by 60 degrees. In some examples, for every 60 degrees of the 360 degree control cycle, the controller is configured to direct the gate driver circuitry to maintain one of the first and second sets of gate drive signals to one of the first, second, and third switch pairs and to transition one of the first and second sets of gate drive signals to another of the first, second, and third switch pairs.

In some examples, a multiphase switching converter controller method (e.g., performed by the controller 106 in FIG. 1, the controller 506 in FIG. 5, or the controller 1200 in FIG. 12) includes generating a first set of gate drive signals (e.g., any of $V_{G1}$ and $V_{G2}$, $V_{G3}$ and $V_{G4}$, or $V_{G5}$ and $V_{G5}$) generating a second set of gate drive signals (e.g., another of $V_{G1}$ and $V_{G2}$, $V_{G3}$ and $V_{G4}$, or $V_{G5}$ and $V_{G5}$), where the first set of gate drive signals is phase-shifted relative to the second set of gate drive signals. The method also includes providing the first set of gate drive signals to a first switch pair of a three-phase inverter (e.g., a respective switch pair corresponding to Q1 and Q2, Q3 and Q4, or Q5 and Q6) and providing the second set of gate drive signals to a second switch pair of the three-phase inverter (e.g., another respective switch pair corresponding to Q1 and Q2, Q3 and Q4, or Q5 and Q6) while the first set of gate drive signals are being provided to the first switch pair. In some examples, generating the first set of gate drive signals includes generating a first high-side control signal with a first duty-cycle, and generating a first low-side control signal with a complementary duty-cycle relative to the first duty-cycle. Also, generating the second set of gate drive signals includes generating a second high-side control signal with the complementary duty-cycle and generating a second low-side control signal with the first duty-cycle.

In some examples, generating the first set of gate drive signals and generating the second set of gate drive signals is based on a digital up-down timer or counter circuit (timer/counter 532 in FIG. 5), an upper threshold (e.g., $D_A$ in FIG. 6), and a lower threshold (e.g., $D_B$ in FIG. 6). In other examples, generating the first set of gate drive signals involves a first analog comparator (e.g., the first comparator 1208 in FIG. 12) with a triangular wave input and a first threshold input. Meanwhile, generating the second set of gate drive signals involves a second analog comparator (e.g., the second comparator 1210 in FIG. 12) with the triangular wave input and a second threshold input.

With the proposed pulse overlap control technique, the PWM sequence for the high-side and low-side switches in one half bridge of an inverter are defined to equalize the losses. In some examples, the PWM sequence involves phase-shifted PWM signals between two phases. In some examples, the PWM sequence is generated using an MCU with the definition of duty-cycle for the top and bottom switches. As desired, the proposed pulse overlap control technique is applicable to a full-bridge or three-phase inverter. In some examples, the proposed pulse overlap control technique is used in a three-phase BLDC motor trapezoidal control scheme, where PWM signals are defined for all the phase switches. With the proposed pulse overlap control technique, faster demagnetization in the motor winding is achieved, reducing the torque ripple. Also, equal RMS current both in high-side and low-side switches leads to equalized losses and temperature.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An electrical system, comprising:
   a plurality of switch pairs, each switch pair having a high-side switch, a low-side switch, and a switch terminal configured to be coupled to a motor;
   gate driver circuitry coupled to each switch of the plurality of switch pairs; and
   a controller coupled to the gate driver circuitry, wherein the controller is coupled to the gate driver circuitry providing a first set of gate drive signals together with a second set of gate drive signals, wherein the first set of gate drive signals is phase-shifted relative to the second set of gate drive signals;
   wherein the first set of gate drive signals includes a high-side gate drive signal with a first duty-cycle D and a low-side gate drive signal with a complementary duty-cycle (1-D) relative to the first duty-cycle, and wherein the second set of gate drive signals includes a high-side gate drive signal with the complementary duty-cycle and a low-side gate drive signal with the first duty-cycle;
   wherein the first duty-cycle D is not equal to the complementary duty-cycle (1-D).

2. The electrical system of claim 1, wherein the controller is configured to direct the gate driver circuitry to provide the first set of gate drive signals and the second set of gate drive signals to each of the plurality of switch pairs in different 120 degree intervals of a 360 degree control cycle, wherein the different 120 degree intervals are spaced from each other by 60 degrees.

3. The electrical system of claim 1, wherein the controller is configured to select the first duty-cycle and the complementary duty-cycle of gate drive signals based on a target pulse-width modulation (PWM) frequency and a target performance parameter.

4. The electrical system of claim 3, wherein the target performance parameter is one of a target winding current of the motor and a target voltage switching duty-cycle of the motor.

5. The electrical system of claim 3, wherein the controller comprises a digital timer or counter configured to provide an up-down ramp with an upper threshold and a lower threshold, wherein the controller selects the first duty-cycle and the complementary duty-cycle of gate drive signals based on the upper and lower thresholds, and wherein the upper and lower thresholds are selected based on a target voltage switching duty-cycle of the motor.

6. A multiphase switching converter controller method, comprising:
   generating a first set of gate drive signals;
   generating a second set of gate drive signals, wherein the first set of gate drive signals is phase-shifted relative to the second set of gate drive signals;
   providing a first set of gate drive signals to a first switch pair of a three-phase inverter; and
   providing a second set of gate drive signals to a second switch pair of the three-phase inverter while the first set of gate drive signals are being provided to the first switch pair;
   wherein generating the first set of gate drive signals comprises:
      generating a first high-side gate drive signal with a first duty-cycle D; and
      generating a first low-side gate drive signal with a complementary duty-cycle (1-D) relative to the first duty-cycle, and
   wherein generating the second set of gate drive signals comprises:
      generating a second high-side gate drive signal with the complementary duty-cycle (1-D); and
      generating a second low-side gate drive signal with the first duty-cycle D;
      wherein the first duty-cycle D is not equal to the complementary duty-cycle (1-D).

7. The method of claim 6, wherein generating the first set of gate drive signals and generating the second set of gate drive signals are based on a digital up-down timer or counter circuit, an upper threshold, and a lower threshold.

8. The method of claim 6,
   wherein generating the first set of gate drive signals involves a first analog comparator with a triangular wave input and a first threshold input, and
   wherein generating the second set of gate drive signals involves a second analog comparator with the triangular wave input and a second threshold input.

* * * * *